United States Patent
Sandhu et al.

(10) Patent No.: US 8,617,959 B2
(45) Date of Patent: *Dec. 31, 2013

(54) RESISTIVE MEMORY AND METHODS OF PROCESSING RESISTIVE MEMORY

(71) Applicant: Micron Technology, Inc., Boise, ID (US)

(72) Inventors: Gurtej S. Sandhu, Boise, ID (US); John A. Smythe, III, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/691,352

(22) Filed: Nov. 30, 2012

(65) Prior Publication Data

US 2013/0099189 A1    Apr. 25, 2013

Related U.S. Application Data

(63) Continuation of application No. 13/226,950, filed on Sep. 7, 2011, now Pat. No. 8,324,065, which is a continuation of application No. 12/701,885, filed on Feb. 8, 2010, now Pat. No. 8,048,755.

(51) Int. Cl.
*H01L 21/20* (2006.01)
*H01L 29/00* (2006.01)

(52) U.S. Cl.
USPC .......................................... 438/381; 257/536

(58) Field of Classification Search
None
See application file for complete search history.

(56) References Cited

U.S. PATENT DOCUMENTS

| | | |
|---|---|---|
| 5,068,199 A | 11/1991 | Sandhu |
| 5,089,986 A | 2/1992 | Sandhu et al. |
| 5,108,943 A | 4/1992 | Sandhu et al. |
| 5,156,987 A | 10/1992 | Sandhu et al. |
| 5,182,232 A | 1/1993 | Chhabra et al. |
| 5,187,638 A | 2/1993 | Sandhu et al. |
| 5,234,855 A | 8/1993 | Rhodes et al. |
| 5,236,860 A | 8/1993 | Fazan et al. |
| 5,837,564 A | 11/1998 | Sandhu et al. |
| 6,156,653 A | 12/2000 | Smythe et al. |
| 6,165,834 A | 12/2000 | Agarwal et al. |
| 6,218,288 B1 | 4/2001 | Li et al. |
| 6,281,072 B1 | 8/2001 | Li et al. |
| 6,410,453 B1 | 6/2002 | Sandhu |
| 6,420,725 B1 | 7/2002 | Harshfield |
| 6,436,195 B1 | 8/2002 | Smythe et al. |
| 6,455,439 B2 | 9/2002 | Sandhu |
| 6,475,921 B2 | 11/2002 | Sandhu |
| 6,489,199 B2 | 12/2002 | Li et al. |

(Continued)

OTHER PUBLICATIONS

Yang, J. Joshua, et al, "A Family of Electronically Reconfigurable Nanodevices", Adv. Mater. (2009) vol. 21, pp. 3754-3758.

(Continued)

*Primary Examiner* — Scott B Geyer
(74) *Attorney, Agent, or Firm* — Brooks, Cameron & Huebsch PLLC (57) ABSTRACT

Resistive memory and methods of processing resistive memory are described herein. One or more method embodiments of processing resistive memory include conformally forming a cell material in an opening in an interlayer dielectric such that a seam is formed in the cell material, forming a conductive pathway by modifying the seam, and forming an electrode on the cell material and the seam.

23 Claims, 4 Drawing Sheets

(56) References Cited

U.S. PATENT DOCUMENTS

| | | |
|---|---|---|
| 6,624,085 B2 | 9/2003 | Sandhu |
| 6,642,112 B1 | 11/2003 | Lowe et al. |
| 6,849,510 B2 | 2/2005 | Lowe et al. |
| 7,262,135 B2 | 8/2007 | Smythe |
| 7,273,796 B2 | 9/2007 | Smythe et al. |
| 7,439,157 B2 | 10/2008 | Bian et al. |
| 7,547,599 B2 | 6/2009 | Sandhu et al. |
| 7,557,047 B2 | 7/2009 | Rueger et al. |
| 7,560,769 B2 | 7/2009 | Sandhu et al. |
| 7,649,242 B2 | 1/2010 | Ufert |
| 7,897,955 B2 | 3/2011 | Jin et al. |
| 7,911,030 B2 | 3/2011 | Chung |
| 8,048,755 B2 | 11/2011 | Sandhu et al. |
| 8,324,065 B2 * | 12/2012 | Sandhu et al. ............ 438/381 |
| 2001/0036743 A1 | 11/2001 | Sandhu |
| 2001/0036745 A1 | 11/2001 | Sandhu |
| 2002/0004272 A1 | 1/2002 | Li et al. |
| 2002/0168855 A1 | 11/2002 | Smythe et al. |
| 2003/0017675 A1 * | 1/2003 | Chen et al. ............ 438/380 |
| 2003/0203577 A1 | 10/2003 | Lowe et al. |
| 2004/0072397 A1 | 4/2004 | Lowe et al. |
| 2005/0186755 A1 | 8/2005 | Smythe, III et al. |
| 2005/0287731 A1 | 12/2005 | Bian et al. |
| 2006/0003596 A1 | 1/2006 | Fucsko et al. |
| 2006/0038293 A1 | 2/2006 | Rueger et al. |
| 2006/0043521 A1 | 3/2006 | Trivedi et al. |
| 2006/0102977 A1 | 5/2006 | Fucsko et al. |
| 2006/0125043 A1 | 6/2006 | Smythe, III et al. |
| 2006/0216906 A1 | 9/2006 | Smythe et al. |
| 2006/0246719 A1 | 11/2006 | Rueger et al. |
| 2006/0265868 A1 | 11/2006 | Rueger et al. |
| 2006/0267075 A1 | 11/2006 | Sandhu et al. |
| 2006/0267131 A1 | 11/2006 | Smythe, III et al. |
| 2007/0004131 A1 | 1/2007 | Trivedi et al. |
| 2007/0049003 A1 | 3/2007 | Smythe |
| 2007/0049004 A1 | 3/2007 | Smythe |
| 2007/0059899 A1 | 3/2007 | Smythe, III et al. |
| 2007/0111470 A1 | 5/2007 | Smythe, III et al. |
| 2007/0158690 A1 | 7/2007 | Ho et al. |
| 2007/0210366 A1 | 9/2007 | Sandhu et al. |
| 2007/0267621 A1 | 11/2007 | Ufert |
| 2007/0287300 A1 | 12/2007 | Rueger et al. |
| 2007/0290293 A1 | 12/2007 | Trivedi et al. |
| 2007/0290294 A1 | 12/2007 | Smythe, III et al. |
| 2008/0085612 A1 | 4/2008 | Smythe et al. |
| 2008/0118731 A1 | 5/2008 | Srinivasan et al. |
| 2008/0121864 A1 | 5/2008 | Seo et al. |
| 2008/0121969 A1 | 5/2008 | Sandhu et al. |
| 2008/0121976 A1 | 5/2008 | Sandhu et al. |
| 2008/0157053 A1 | 7/2008 | Lai et al. |
| 2008/0194088 A1 | 8/2008 | Srinivasan et al. |
| 2008/0247219 A1 | 10/2008 | Choi et al. |
| 2009/0011607 A1 | 1/2009 | Smythe et al. |
| 2009/0045447 A1 | 2/2009 | Ramaswamy et al. |
| 2009/0072211 A1 | 3/2009 | Lee et al. |
| 2009/0115064 A1 | 5/2009 | Sandhu et al. |
| 2009/0148981 A1 | 6/2009 | Lai et al. |
| 2009/0194757 A1 | 8/2009 | Lam et al. |
| 2009/0225602 A1 | 9/2009 | Sandhu et al. |
| 2009/0239389 A1 | 9/2009 | Rueger et al. |
| 2009/0250681 A1 | 10/2009 | Smythe et al. |
| 2009/0253271 A1 | 10/2009 | Sinha et al. |
| 2009/0263962 A1 | 10/2009 | Sandhu et al. |
| 2009/0309087 A1 | 12/2009 | Lung |
| 2010/0065836 A1 | 3/2010 | Lee |

OTHER PUBLICATIONS

International Search Report and Written Opinion for related PCT Application No. PCT/US2011/000152 dated Aug. 30, 2011 (10 pages).

Taiwan office Action in related Taiwan Application No. 100104182. Mailed Jun. 13, 2013. (3 pages).

* cited by examiner

RESISTIVE MEMORY AND METHODS OF PROCESSING RESISTIVE MEMORY

PRIORITY INFORMATION

This application is a Continuation of U.S. patent application Ser. No. 13/226,950, filed Sep. 7, 2011, to be issued on Dec. 4, 2012 as U.S. Pat. No. 8,324,065, which is a Continuation of U.S. patent application Ser. No. 12/701,885, filed Feb. 8, 2010 and issued Nov. 1, 2011 as U.S. Pat. No. 8,048,755, the specifications of which are incorporated by reference herein.

TECHNICAL FIELD

The present disclosure relates generally to semiconductor memory devices and methods, and systems, and more particularly, to resistive memory and methods of processing resistive memory.

BACKGROUND

Memory devices are typically provided as internal, semiconductor, integrated circuits in computers or other electronic devices. There are many different types of memory, including random-access memory (RAM), read only memory (ROM), dynamic random access memory (DRAM), synchronous dynamic random access memory (SDRAM), flash memory, and resistive, e.g., resistance variable, memory, among others. Types of resistive memory include programmable conductor memory, phase change random access memory (PCRAM), and resistive random access memory (RRAM), among others.

Memory devices are utilized as non-volatile memory for a wide range of electronic applications in need of high memory densities, high reliability, and low power consumption. Non-volatile memory may be used in, for example, personal computers, portable memory sticks, solid state drives (SSDs), digital cameras, cellular telephones, portable music players such as MP3 players, movie players, and other electronic devices.

Memory devices may include a number of memory cells arranged in a matrix, e.g., array. For example, an access device, such as a diode, a field effect transistor (FET), or bipolar junction transistor (BJT), of the memory cells may be coupled to an access line, e.g., word line, forming a "row" of the array. The memory elements of each memory cell may be coupled to a data line, e.g., bit line, in a "column" of the array. In this manner, the access device of a memory cell may be accessed through a row decoder activating a row of memory cells by selecting the word line coupled to their gates. The programmed state of a row of selected memory cells may be determined, e.g., sensed, by causing different currents, to flow in the memory elements depending on the resistance associated with a programmed state for a particular memory cell.

Memory cells may be programmed, e.g., written, to a desired state. That is, one of a number of programmed states, e.g., resistance levels, can be set for a memory cell. For example, a single level cell (SLC) can represent one of two logic states, e.g., 1 or 0. Resistive memory cells can also be programmed to one of more than two programmed states, such as to represent more than two binary digits, e.g., 1111, 0111, 0011, 1011, 1001, 0001, 0101, 1101, 1100, 0100, 0000, 1000, 1010, 0010, 0110, or 1110. Such cells may be referred to as multi state memory cells, multi-digit cells, or multilevel cells (MLCs).

Resistive memory such as RRAM may store data by varying the resistance level of a resistive memory element. Data may be programmed to a selected RRAM cell by applying sources of energy, such as positive or negative electrical pulses, e.g., positive or negative voltage or current pulses, to a particular resistive memory element for a predetermined duration. RRAM cells may be programmed to a number of resistance levels by application of voltages or currents of various magnitudes, polarities, and durations.

Methods for processing, e.g., fabricating, RRAM cells may include planar fabrication of RRAM cells. That is, RRAM cells may have a planar structure. However, RRAM cells having a planar structure may be large, e.g., RRAM cells having a planar structure may increase the size of an RRAM device. Further, RRAM cells having a planar structure may operate inconsistently or erroneously, e.g., the sensed resistance level of an RRAM cell having a planar structure may be different than the resistance level to which that cell was programmed.

DETAILED DESCRIPTION

Resistive memory and methods of processing resistive memory are described herein. One or more method embodiments of processing resistive memory include conformally forming a cell material in an opening in an interlayer dielectric such that a seam is formed in the cell material, forming a conductive pathway by modifying the seam, and forming an electrode on the cell material and the seam.

Processing resistive memory, e.g., resistive memory cells, in accordance with a number of embodiments of the present disclosure can decrease the size of the resistive memory cells and/or memory devices associated with the resistive memory cells. Processing resistive memory in accordance with a number of embodiments of the present disclosure can also increase the consistency and reliability of the resistive memory. For example, processing resistive memory in accordance with embodiments of the present disclosure can decrease the number of erroneous data reads associated with resistive memory.

In the following detailed description of the present disclosure, reference is made to the accompanying drawings that form a part hereof, and in which is shown by way of illustration how a number of embodiments of the disclosure may be practiced. These embodiments are described in sufficient detail to enable those of ordinary skill in the art to practice a number of embodiments of this disclosure, and it is to be understood that other embodiments may be utilized and that process, electrical, or mechanical changes may be made without departing from the scope of the present disclosure.

As will be appreciated, elements shown in the various embodiments herein can be added, exchanged, and/or eliminated so as to provide a number of additional embodiments of the present disclosure. In addition, as will be appreciated, the proportion and the relative scale of the elements provided in the figures are intended to illustrate the embodiments of the present invention, and should not be taken in a limiting sense. As used herein, "a number of" something can refer to one or more such things. For example, a number of memory devices can refer to one or more memory devices.

Figure 1A:
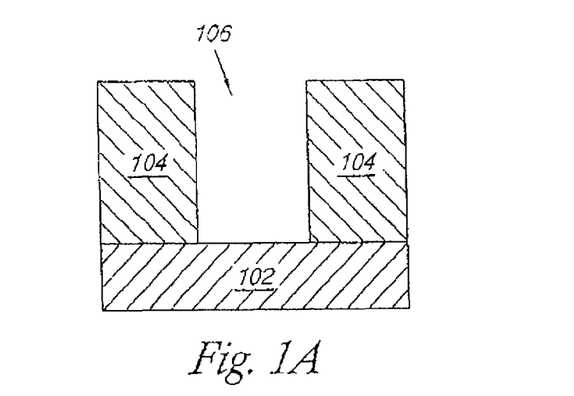
FIGS. 1A-1G illustrate process steps associated with forming a resistive memory cell in accordance with a number of embodiments of the present disclosure.

FIGS. 1A-1G illustrate process steps associated with forming a resistive memory cell in accordance with a number of embodiments of the present disclosure. FIG. 1A illustrates a schematic cross-sectional view of an interlayer dielectric 104 on an electrode 102, with an opening 106 in interlayer dielectric 104. Electrode 102 can be, for example, tungsten or platinum. Interlayer dielectric 104 can be, for example, an oxide dielectric, such as silicon dioxide ($SiO_2$). Interlayer dielectric 104 could also be, for example, a nitride dielectric, such as silicon nitride ($Si_3N_4$). Embodiments of the present disclosure are not limited to a particular type of interlayer dielectric material or electrode.

Interlayer dielectric 104 can be formed on electrode 102 in a number of ways, including chemical vapor deposition (CVD) or atomic layer deposition (ALD), as will be appreciated by one of skill in the art. A portion of interlayer dielectric 104 can then be removed, e.g., etched and/or patterned, to form opening 106. Opening 106 is adjacent to electrode 102, as shown in FIG. 1.

In a number of embodiments, opening 106 can have a diameter of 10 to 30 nanometers. For example, opening 106 can have a diameter of approximately 22 nanometers, approximately 25 nanometers, or approximately 27 nanometers. However, embodiments are not limited to a particular diameter for opening 106.

Figure 1B:
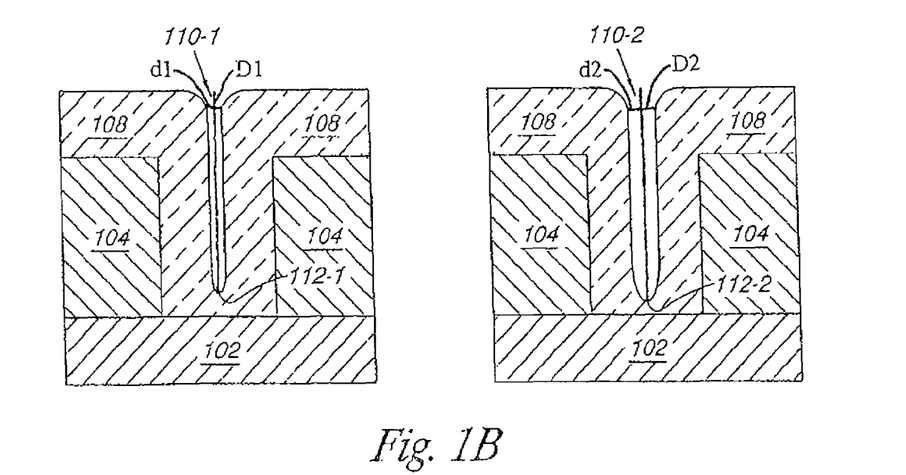

FIG. 1B illustrates a schematic cross-section view of the structure shown in FIG. 1A after a subsequent processing step. FIG. 1B includes a resistive memory cell material 108 formed on interlayer dielectric 104 and in opening 106 in interlayer dielectric 104. In a number of embodiments, resistive memory cell material 108 can be conformally formed on interlayer dielectric 104 and in opening 106. Resistive memory cell material 108 can be conformally formed on interlayer dielectric 104 and in opening 106 in a number of ways, including ALD, CVD, and plating. Further, the method of conformal formation can include having a portion of resistive memory cell material 108 that is in bottom up fill or selective mode. However, embodiments of the present disclosure are not limited to a particular method of conformal formation. The method of conformal formation used can depend on, for example, the material used for resistive memory cell material 108.

Resistive memory cell material 108 can be, for example, a resistance random access memory (RRAM) cell material. RRAM cell materials can include, for example, $Ge_xSe_y$, a binary metal oxide such as $Cu_xO_y$, $WO_x$, $Nb_2O_5$, $Al_2O_3$, $Ta_2O_5$, $TiO_x$, $ZrO_x$, $Ni_xO$, and $Fe_xO$, and/or other materials that can support solid phase electrolyte behavior. Other RRAM cell materials can include perovskite oxides such as doped or undoped $SrTiO_3$, $SrZrO_3$, and $BaTiO_3$, colossal magnetoresistive materials such as $Pr_{(1-x)}Ca_xMnO_3$ (PCMO), $La_{(1-x)}CaxMnO_3$ (LCMO), and $Ba_{(1-x)}Sr_xTiO_3$, and polymer materials such as Bengala Rose, $AlQ_3Ag$, Cu-TCNQ, DDQ, TAPA, and Fluorescine-based polymers, among other types of RRAM cell materials.

In a number of embodiments, resistive memory cell material 108 can be conformally formed, e.g., conformally deposited, on interlayer dielectric 104 and in opening 106 such that a seam, e.g., seams 110-1 and 110-2 shown in FIG. 1B, is formed in resistive memory cell material 108. As shown in FIG. 1B, the seam can be an opening in resistive memory cell material 108, e.g., a region where the opposite sides of resistive memory cell material 108 approach each other such that resistive memory cell material 108 does not completely fill opening 106. That is, resistive memory cell material 108 can be formed on interlayer dielectric 104 and in opening 106 such that resistive memory cell material conforms to interlayer dielectric 104 and forms a seam in resistive memory cell material 108. In a number of embodiments, the seam formed in resistive memory cell material 108 can be modified to form a conductive pathway in resistive memory cell material 108, as will be further described herein.

FIG. 1B illustrates a first and a second seam, e.g., seams 110-1 and 110-2, that can result from conformal formation of resistive memory cell material 108 in accordance with a number of embodiments of the present disclosure. As shown in FIG. 1B, seams 110-1 and 110-2 have different characteristics. Differentiating characteristics can include surface, or near surface, modification as part of the terminating portion of a deposition procedure.

The characteristics of the seam formed in resistive memory cell material 108 can depend on the amount of time for which the conformal formation of resistive memory cell material 108 occurs. For example, the diameter and/or depth of the seam can decrease as the amount of time for which the conformal formation of resistive memory cell material 108 occurs increases. In the embodiments illustrated in FIG. 1B, the amount of time for which the conformal formation that results in the formation of seam 110-1 occurs can be greater than the amount of time for which the conformal formation that results in the formation of seam 110-2 occurs. For example, the diameter d1 of seam 110-1 is less than the diameter d2 of seam 110-2, as will be further described herein. Additionally, the depth D1 of seam 110-1 is less than the depth D2 of seam 110-2, e.g., bottom portion 112-2 of seam 110-2 is closer to electrode 102 than bottom portion 112-1 of seam 110-1, as shown in FIG. 1B.

In a number of embodiments, resistive memory cell material 108 can be conformally formed in opening 106 such that there is resistive memory cell material 108 between the bottom of the seam and electrode 102, e.g., such that the seam is not in contact with electrode 102. For example, as shown in FIG. 1B, seams 110-1 and 110-2 are conformally formed such that there is resistive memory cell material 108 between bottom portions 112-1 and 112-2 of seams 110-1 and 110-2, e.g., such that seams 110-1 and 110-2 are not in contact with electrode 102.

The distance between the bottom of the seam and electrode 102 can depend on the amount of time for which the conformal formation of resistive memory cell material 108 occurs. For example, the distance between the bottom of the seam and electrode 102 can increase as the amount of time for which the conformal formation of resistive memory cell material 108 occurs increases. In the embodiments illustrated in FIG. 1B, the amount of time for which the conformal formation that results in the formation of seam 110-1 occurs can be greater than the amount of time for which the conformal formation that results in the formation of seam 110-2 occurs. For example, the distance between bottom portion 112-1 and electrode 102 is greater than the distance between bottom portion 112-2 and electrode 102, as shown in FIG. 1B. In a number of embodiments, the distance between the bottom of the seam and electrode 102 can be in the range of 3 Angstroms to 15 Angstroms. However, embodiments of the present disclosure are not so limited. For example, the distance between the bottom of the seam and electrode 102 can be up to 100 Angstroms.

Figure 1C:
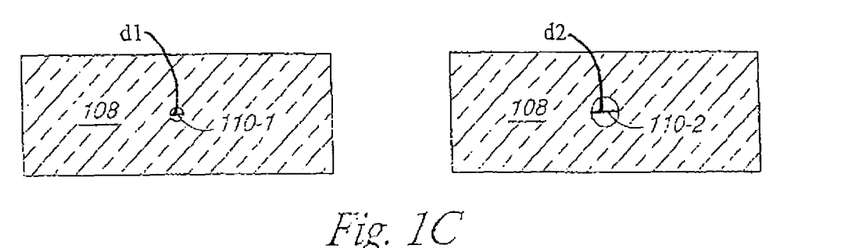

FIG. 1C illustrates a schematic top view of resistive memory cell material 108 having seams 110-1 and 110-2 formed therein. That is, FIG. 1C illustrates a schematic top view of the conformal formations of resistive memory cell material 108 shown in FIG. 1B. As shown in FIG. 1C, the diameter d1 of seam 110-1 is less than the diameter d2 of seam 110-2.

In a number of embodiments, the seam formed in resistive memory cell material 108, e.g., seams 110-1 and 110-2, can have a diameter of 0.5 to 5.0 nanometers. For example, the seam can have a diameter of approximately 1 nanometer. The diameter of the seam can be measured, for example, at the top of the seam.

The characteristics of the seam formed in resistive memory cell material 108, e.g., the depth and/or diameter of the seams, and/or the distance between the bottom of the seam and electrode 102, can result from the conformal formation of resistive memory cell material 108 on interlayer dielectric 104 and in opening 106, in accordance with a number of embodiments of the present disclosure. However, these characteristics of the seam may not be achievable using previous approaches, e.g., planar fabrication.

Figure 1D:
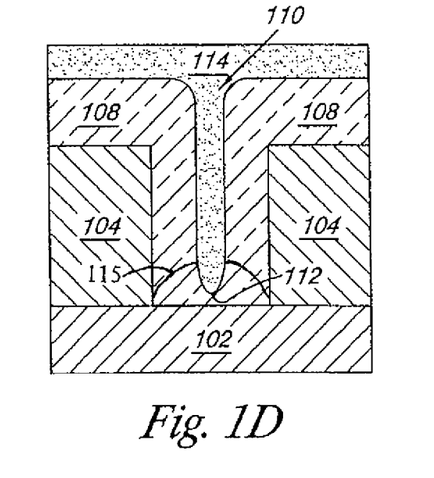

FIG. 1D illustrates a schematic cross-sectional view of the structure shown in FIGS. 1B and 1C after a subsequent processing step. FIG. 1D includes a filament 114 formed on resistive memory cell material 108 and in, e.g., within, a seam 110 in resistive memory cell material 108. Filament 114 can be a modifier material that is a different material than resistive memory cell material 108 and/or forms a conductive pathway in seam 110 such that seam 110 is a conductive pathway. That is, forming filament 114 in seam 110 can modify seam 110 to form a conductive pathway in resistive memory cell material 108. Filament 114 can be, for example, a metal, such as silver and copper, or a metal oxide, such as copper oxide and silver oxide. That is, filament 114 can be, for example, a metal, such as copper and silver, that is readily oxidized or reduced in solid phase. Filament 114 can be part of an additional, e.g., top, electrode structure, such as electrode 116 described in connection with FIG. 1G.

In a number of embodiments, filament 114 can be a filament source material. That is, filament 114 can contain atoms that can form a filament within resistive memory cell material 108.

Filament, e.g., filament source material, 114 can be formed on resistive memory cell material 108 and in seam 110 in a number of ways, including spin-coating, spray, ALD, CVD, and condensation. Forming filament source material 114 in seam 110 can increase the concentration of atoms in filament source material 114. Because the concentration of atoms in filament source material 114 can be increased, filament source material 114 can be a thin material, e.g., filament source material 114 can have a thickness that is less than the thickness of resistive memory cell material 108, as shown in FIG. 1D.

As shown in FIG. 1D, filament source material 114 can be formed in seam 110 such that an end of filament source material 114 is adjacent to bottom portion 112 of seam 110. Because the end of filament source material 114 can be adjacent to bottom portion 112 of seam 110, there can be resistive memory cell material 108 between the end of filament source material 114 and electrode 102, filament source material 114 may not be in contact with electrode 102, and/or the distance between the end of filament source material 114 and electrode 102 can be in the range of 3 Angstroms to 15 Angstroms. Filament source material 114 can also be formed in seam 110 such that filament source material 114 completely fills seam 110, as shown in FIG. 1D.

In a number of embodiments, filament source material 114 can be heated after it is formed on resistive memory cell material 104 and in seam 110. Heating filament source material 114 can diffuse atoms from filament source material 114 into resistive memory cell material 104.

As previously described herein, forming filament source material 114 in seam 110 can modify seam 110 to form a conductive pathway in resistive memory cell material 108. This conductive pathway can be formed without forming any additional material between the end of filament source material 114 and bottom electrode 102 to couple the end of filament source material 114 to bottom electrode 102. Rather, the conductive pathway can include a conductive path that extends through region 115 in resistive memory cell material 108, along a path from the end of filament source material 114 to bottom electrode 102. That is, the conductive pathway can be formed with only resistive memory cell material 108 formed between the end of filament source material 114 and bottom electrode material 102, e.g., with only resistive memory cell material 108 in region 115.

Figure 1E:
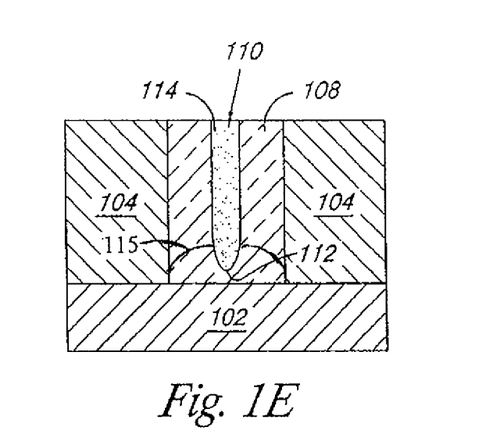

FIG. 1E illustrates a schematic cross-sectional view of the structure shown in FIG. 1D after a subsequent processing step. In FIG. 1E, a portion of resistive memory cell material 108 and a portion of filament source material 114 are removed. The removed portions of resistive memory cell material 108 and filament source material 114 can be removed, e.g., etched and/or patterned, in a number of ways, including chemical mechanical polishing (CMP) and blanket etching.

The removed portion of resistive memory cell material 108 can include, for example, the portion of resistive memory cell material 108 that is not in opening 106. The removed portion of filament source material 114 can include, for example, the portion of filament source material 114 that is not in seam 110. Removing these portions of resistive memory cell material 108 and filament source material 114 can expose interlayer dielectric 104, as shown in FIG. 1E.

Figure 1F:
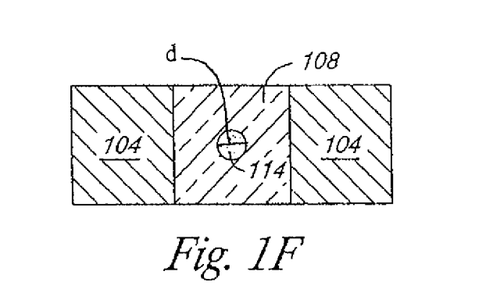

FIG. 1F illustrates a schematic top view of FIG. 1E. In a number of embodiments, filament source material 114 can have a diameter d of 0.5 to 5.0 nanometers. For example, filament source material 114 can have a diameter d of approximately 1 nanometer. The diameter d of filament source material 114 can correspond to the diameter of seam 110. For example, in embodiments in which filament source material 114 completely fills seam 110, the diameter d of filament source material 114 can correspond to the diameter of seam 110 at the top of seam 110.

Figure 1G:
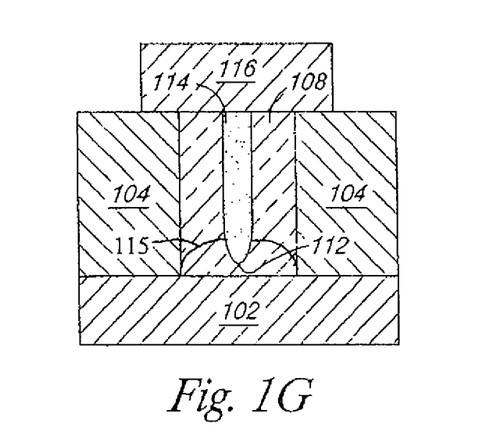

FIG. 1G illustrates a schematic cross-sectional view of the structure shown in FIGS. 1E and 1F after a subsequent processing step. FIG. 1G includes an electrode 116 formed on interlayer dielectric 104, resistive memory cell material 108, and filament source material 114. Electrode 116 can be, for example, tungsten or platinum. Electrode 116 can be formed, e.g., deposited and patterned, on interlayer dielectric 104, resistive memory cell material 108, and filament source material 114 in a number of ways, as will be appreciated by one of skill in the art. In a number of embodiments, filament source material 114 can be part of the structure of electrode 116, as previously described herein.

The structure illustrated in FIG. 1G can be a component, e.g., portion, of a resistive memory cell. For example, the structure illustrated in FIG. 1G can be a component of an RRAM cell, e.g., memory cell 212 shown in FIG. 2.

Resistive memory cells, e.g., RRAM cells, processed in accordance with a number of embodiments of the present disclosure can decrease the size of the resistive memory cells and/or memory devices associated with the resistive memory cells. Resistive memory cells processed in accordance with a number of embodiments of the present disclosure can also have increases consistency and reliability. For example, resistive memory cells processed in accordance with a number of embodiments of the present disclosure can have increased reliability as compared to memory cells processed in accordance with previous approaches, e.g., planar fabrication.

As one example, the distance between bottom portion 112 of seam 110 in resistive memory cell material 108, e.g., the end of filament source material 114, and electrode 102, can be in the range of 3 Angstroms to 15 Angstroms, as previously described herein, which can decrease the size of the resistive memory cell. This distance can also improve the performance of filament source material 114, which can increase the consistency and reliability of the resistive memory cell, e.g., memory cell 212 shown in FIG. 2. This distance can result from the conformal formation of resistive memory cell material 108 on interlayer dielectric 104 and in opening 106, in accordance with a number of embodiments of the present disclosure. However, this distance may not be achievable using previous approaches, e.g., planar fabrication.

Additionally, opening 106 can have a diameter of 10 to 30 nanometers, as previously described herein. Further, seam 110 in resistive memory cell material 108, e.g., filament source material 114, can have a diameter of 0.5 to 5.0 nanometers, as previously described herein. These dimensions can also decrease the size of the resistive memory cell. These dimensions can result from the conformal formation of resistive memory cell material 108 and interlayer dielectric 104 and in opening 106, in accordance with a number of embodiments of the present disclosure. However, these dimensions may not be achievable using previous approaches, e.g., planar fabrication.

Resistive memory cells processed in accordance with a number of embodiments of the present disclosure can also decrease the effect of grain boundaries in resistive memory cell material 108. For example, resistive memory cell material 108 may contain grain boundaries, and filament source material 114 may diffuse faster along the grain boundaries. However, embodiments of the present disclosure can restrict the grain boundary interaction area to the central point of filament source material 114, e.g., the central point of seam 110 in resistive memory cell material 108. This can reduce failures associated with the grain boundaries, which can increase the consistency and reliability of the resistive memory cell. This grain boundary area interaction restriction can result from the conformal formation of resistive memory cell material 108 on interlayer dielectric 104 and in opening 106, in accordance with a number of embodiments of the present disclosure. However, this grain boundary area interaction restriction may not be achievable using previous approaches, e.g., planar fabrication.

Figure 2:
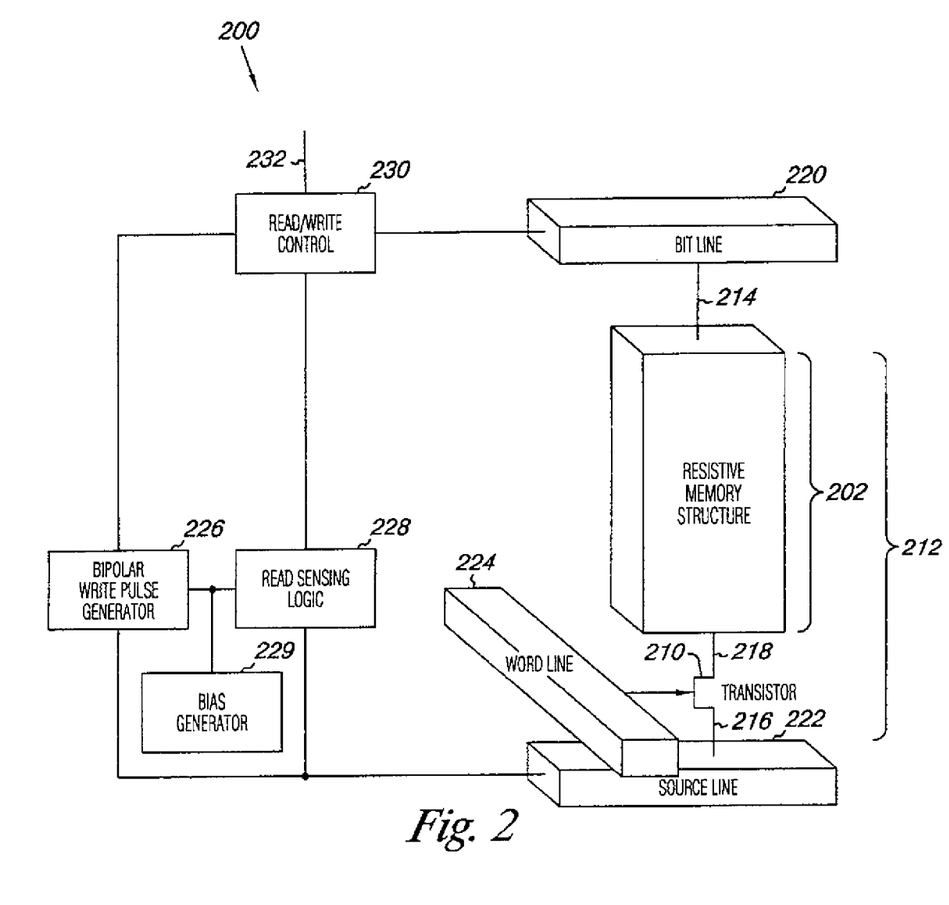
FIG. 2 illustrates a functional block diagram of a resistive memory in accordance with a number of embodiments of the present disclosure.

FIG. 2 illustrates a functional block diagram of a resistive memory 200 in accordance with a number of embodiments of the present disclosure. As shown in FIG. 2, resistive memory 200 includes resistive memory structure 202. Resistive memory structure 202 can be a structure processed in accordance with a number of embodiments of the present disclosure. For example, resistive memory structure 202 can be the structure illustrated in FIG. 1G.

In FIG. 2, access device 210 is coupled in series with resistive memory structure 202 to form memory cell 212. Memory cell 212 is coupled to data line, e.g., bit line, 220 and source line 222. Access device 210 can serve as a switch for enabling and disabling current flow through resistive memory structure 202. Access device 210 can be, for example, a transistor, such as a field effect transistor (FET) or bipolar junction transistor (BJT), with a gate coupled to access line, e.g., word line, 224. Thus, when word line 224 is energized, access device 210 can be turned on, thereby completing the circuit between source line 222 and bit line 220 through resistive memory structure 202.

In a number of embodiments, bit line 220 and source line 222 are coupled to logic for sensing, e.g., reading, from, and logic for programming, e.g., writing, memory cell 212. For example, as shown in FIG. 2, read/write control multiplexer 230 has an output coupled to bit line 220. Read/write control multiplexer 230 can be controlled by read/write control logic line 232 to select between a first input coupled to bipolar write pulse generator 226, and a second input coupled to read sensing logic 228. The magnitude, polarity, and/or duration of voltage or current applied to resistive memory structure 202 for programming can be controlled by application thereof between bit line 220 and source line 222 associated with memory cell 212.

In a number of embodiments, during a write operation, bias generator 229 can establish, through bipolar write pulse generator 226, a write bias voltage potential difference between bit line 220 and source line 222, e.g., a fixed voltage, associated with memory cell 212. The write bias voltage can cause a particular magnitude of current to flow through resistive memory structure 202, which can change the resistance of resistive memory structure 202 to a particular resistance. The particular resistance can correspond to the programmed state of resistive memory structure 202.

In a number of embodiments, during a read operation, bias generator 129 can establish, through read sensing logic 228, a read bias voltage potential difference between bit line 220 and source line 222, e.g., a fixed voltage, associated with memory cell 212. The read bias voltage can cause a particular magnitude of current to flow corresponding to the resistance of resistive memory structure 202. For example, the greater the resistance of resistive memory structure 202, the smaller the current that flows for a given read bias voltage according to Ohm's law. The amount of current flowing through resistive memory structure 202 during a read operation (or a voltage proportional thereto) can be sensed by read sensing logic 228, e.g., a sense amp (not shown) can compare a circuit-derived input to a reference input that corresponds to a boundary condition between two programmed states, to determine an output corresponding to the programmed state represented by the present resistance of resistive memory structure 202.

In a number of embodiments, a read current can be applied through resistive memory structure 202 causing a corresponding voltage to be developed, which can be sensed and compared to a reference voltage. From the comparison, the resistance of resistive memory structure 202 can be determined, e.g., based on the principles of Ohm's law.

Although FIG. 2 illustrates, and the discussion above describes, a particular read and write logic arrangement, one of skill in the art will appreciate that a number of embodiments of the present disclosure can be implemented using other configurations of logic for switching and/or programming resistive memory structure 202. Further, resistive memory 200 can include additional elements and/or circuitry not shown in FIG. 2 so as not to obscure embodiments of the present disclosure, as will be appreciated by one of skill in the art.

CONCLUSION

Resistive memory and methods of processing resistive memory are described herein. One or more method embodiments of processing resistive memory include conformally forming a cell material in an opening in an interlayer dielectric such that a seam is formed in the cell material, forming a conductive pathway by modifying the seam, and forming an electrode on the cell material and the seam.

Although specific embodiments have been illustrated and described herein, those of ordinary skill in the art will appreciate that an arrangement calculated to achieve the same results can be substituted for the specific embodiments shown. This disclosure is intended to cover adaptations or variations of various embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of the various embodiments of the present disclosure includes other applications in which the above structures and methods are used. Therefore, the scope of various embodiments of the present disclosure should be determined with reference to the appended claims, along with the full range of equivalents to which such claims are entitled.

In the foregoing Detailed Description, various features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. A method of processing a memory cell, comprising:
   forming a seam in a cell material;
   wherein the seam is formed in the cell material by conformally forming the cell material; and
   forming a conductive pathway in the seam.

2. The method of claim 1, wherein the method includes heating the conductive pathway after forming the conductive pathway in the seam.

3. The method of claim 1, wherein the method includes removing a portion of the cell material after forming the seam in the cell material.

4. The method of claim 3, wherein the method includes forming an electrode on the cell material and the seam after removing the portion of the cell material.

5. A method of processing a memory cell, comprising:
   conformally forming a cell material such that a seam is formed in the cell material;
   wherein the seam is an opening in the cell material; and
   modifying the seam, wherein modifying the seam includes forming a filament in the seam.

6. The method of claim 5, wherein the method includes forming the filament in the seam such that the filament completely fills the seam.

7. A method of processing a memory cell, comprising:
   conformally forming a cell material such that a seam is formed in the cell material;
   forming a conductive pathway in the seam; and
   removing a portion of the conductive pathway.

8. The method of claim 7, wherein the method includes diffusing atoms from the conductive pathway into the cell material after forming the conductive pathway in the seam.

9. The method of claim 7, wherein the conductive pathway is a different material than the cell material.

10. The method of claim 7, wherein forming the conductive pathway in the seam increases a concentration of atoms in the conductive pathway.

11. The method of claim 7, wherein the method includes forming the conductive pathway in the seam such that an end of the conductive pathway is adjacent to a bottom of the seam.

12. The method of claim 7, wherein the removed portion of the conductive pathway includes a portion of the conductive pathway that is not in the seam.

13. A memory cell, comprising:
    a conformally formed cell material having a seam formed therein; and
    a conductive pathway in the seam, wherein the conductive pathway has a diameter of 5.0 nanometers or less.

14. The memory cell of claim 13, wherein the conductive pathway includes a filament.

15. The memory cell of claim 14, wherein a thickness of the filament is less than a thickness of the cell material.

16. The memory cell of claim 13, wherein the cell material is a resistive memory cell material.

17. A memory cell, comprising:
    a dielectric material having an opening;
    a cell material in the opening;
    a seam in the cell material; and
    an electrode adjacent the opening, wherein the electrode is not in contact with the seam.

18. The memory cell of claim 17, wherein the cell material is conformally formed in the opening.

19. The memory cell of claim 17, wherein the memory cell includes a conductive pathway in the seam.

20. The memory cell of claim 17, wherein the memory cell includes only cell material between a bottom of the seam and the electrode.

21. The memory cell of claim 17, wherein a distance between a bottom of the seam and the electrode is 15 Angstroms or less.

22. The memory cell of claim 17, wherein the cell material conforms to the dielectric material.

23. The memory cell of claim 17, wherein the opening has a diameter of 30 nanometers or less.

* * * * *